United States Patent [19]

Moriyama et al.

[11] 4,409,860
[45] Oct. 18, 1983

[54] APPARATUS FOR PRECISELY MOVING A TABLE

[75] Inventors: Shigeo Moriyama, Hachioji; Masaaki Ito, Kokubunji; Tatsuo Harada, Fuchu, all of Japan

[73] Assignee: Hitachi, Ltd., Tokyo, Japan

[21] Appl. No.: 138,095

[22] Filed: Apr. 7, 1980

[30] Foreign Application Priority Data

Apr. 6, 1979 [JP] Japan .................................. 54-41108

[51] Int. Cl.³ ........................ G05G 11/00; A47B 11/00
[52] U.S. Cl. .................................... 74/479; 108/143; 248/657; 269/60
[58] Field of Search .......................... 108/20, 137, 143; 248/178, 651, 657, 429; 269/60, 56, 73, 58; 33/1 M; 74/479

[56] References Cited

U.S. PATENT DOCUMENTS

| | | | |
|---|---|---|---|
| 1,760,710 | 5/1930 | Mitchell | 74/479 |
| 2,164,412 | 7/1939 | Koster | 33/1 M |
| 2,941,136 | 6/1960 | Marantette | 33/1 M |
| 3,124,018 | 3/1964 | Gough | 269/60 |
| 3,155,383 | 11/1964 | Whitmore | 269/58 |
| 3,586,273 | 6/1971 | Sloyan | 248/657 |
| 3,638,933 | 2/1972 | Burnette | 269/60 |
| 3,690,642 | 9/1972 | Angelstrand | 269/60 |
| 3,743,904 | 7/1973 | Wiesler | 269/60 |
| 3,801,090 | 4/1974 | Gillen | 269/60 |
| 3,918,167 | 11/1975 | Gerber | 33/1 M |
| 4,193,317 | 3/1980 | Oono et al. | 74/479 |

Primary Examiner—Francis K. Zugel
Attorney, Agent, or Firm—Antonelli, Terry & Wands

[57] ABSTRACT

In an apparatus for precisely moving a table, rectilinear drive systems for both X- and Y-axes are fixed to a support frame, a movable stage is constructed so as to have its motion in the direction of one of these axes constrained by the motion of the rectilinear drive system for the one axis and to have its motion in the direction of the other axis constrained by the rectilinear motion of the rectilinear drive system for the other axis, and means for coupling the rectilinear drive system for at least one of the axes and the movable stage so as to have a backlash.

11 Claims, 5 Drawing Figures

APPARATUS FOR PRECISELY MOVING A TABLE

BACKGROUND OF THE INVENTION

This invention relates to an apparatus for precisely moving a table or stage, the apparatus being used in a step and repeat camera, a step and repeat projection printing apparatus, etc.

An apparatus, such as a step and repeat camera, of the type mentioned above, operates to project and print an integrated circuit pattern photographically on a mask substrate or wafer which is usually coated with a photoresist layer. Because of the inherent restriction of the image area of a projection lens, however, it is impossible to print the whole area of the aforecited mask substrate or wafer in a single step. Therefore, a precision X-Y movable table is provided in such equipment and the mask substrate or wafer is installed thereon. While performing intermittent feed operations in the X- and Y-directions, the integrated circuit pattern is arrayed and printed on the entire area of the mask substrate or wafer.

In the production of an integrated circuit, it is required that circuit patterns differing from one another be overlapped on a single wafer with a positioning precision of approximately 0.2 μm, ordinarily 8 to 12 times or so. Therefore, an equal or higher positioning precision is usually required for the positioning precision of the X-Y movable table. Further, it is a requirement that such X-Y movable table be capable of high-speed positioning in order to enhance the productivity of the system.

Therefore, many of the X-Y movable tables of this sort have heretofore been of such construction that a Y-directional movable table is stacked on an X-directional movable table and that a driving system for the Y-directional movement including a motor, feed screws, etc., is installed on the X-directional movable table. Although such a construction attains a comparatively excellent machine precision, the masses of the movable parts inevitably become great and the necessary high-speed positioning as mentioned above is impossible to attain in practice.

As an improvement on such prior art apparatus, there has been proposed an X-Y movable table as shown in FIG. 1 wherein both X- and Y-driving systems are fixed to a support frame, as disclosed in "Kikai Sekkei (Machine Design)," Volume 14, No. 2, 1970, page 35). With this structure, however, in the case where the movable table moves in the Y-axial direction, the guide surfaces for the Y-directional movable table are formed by surfaces of the X-frame portion 1 and the Y-frame portion 2, with the result that the straightness of the moving direction of the table cannot be maintained accurately. In addition, there are many rolling guide surfaces associated with these frame members, which surfaces are required to be hard to prevent rapid wear, and long periods of time are required for working and for assemblage and adjustment of this apparatus in order to ensure that the precision of the movable table is higher.

In an apparatus of this sort, these problems can be somewhat solved by replacing the rolling guide with a sliding guide which employs a higher polymer material for the sliders. More specifically, since a sliding guide does not require the same degree of hardness of the guide surfaces to prevent wear as does the rolling guide, the working of the members is facilitated, and since the contact areas between the sliders and the guide surfaces can be made large, minute form errors in the guide surfaces are averaged, so that the sliding guide is capable of movements of higher precision as compared with the rolling guide. Further, the sliding friction exhibited by the sliding guide provides a more rapid settling of the table after its movement so that the positioning can be made much faster than that in the case of the rolling guide.

However, even when such a sliding guide is utilized, the X-Y two dimensional movable table as described above incurs another disadvantage in contrast to the aforecited advantages. That is, strain energy which corresponds to the parallelism error between both of the guide surfaces of the X-frame portion 1 and the Y-frame portion 2 in FIG. 1 is accummulated in the frame members, etc., and this brings about the disadvantage that yaw or stick slip is caused. This is attributed to the frictional forces of the sliding parts. A further disadvantage is that the strain energy is gradually released to give rise to a phenomenon in which the movable table drifts at a very low speed of, for example, 0.1 to 0.5 μm/sec after the positioning thereof.

SUMMARY OF THE INVENTION

This invention has been made with note taken of the above-mentioned points, and has for its object to provide an apparatus for precisely moving a table which permits high-speed positioning and high-precision movement of the movable table.

In order to accomplish this object, the present invention provides for rectilinear driving means respectively fixed and disposed on X- and Y-coordinate axes, a movable table which is constructed so as to have its motion in the direction of one of the X- and Y-axes constrained by the motion of said rectilinear driving means in the one axial direction and to have its motion in the direction of the other axis constrained by the rectilinear motion of said rectilinear driving means in the other axial direction, and means to couple said movable table and said rectilinear driving means in at least one of the X- and Y-axial directions with a backlash provided therebetween.

By provision of this backlash in the coupling between the driving means and the movable table, at least the undesirable drifting which has occurred in known arrangements at the end of the positioning operation can be eliminated.

DETAILED DESCRIPTION OF THE PREFERRED EMBODIMENTS

Hereunder, this invention will be described in detail with reference to various exemplary embodiments.

Figure 1:
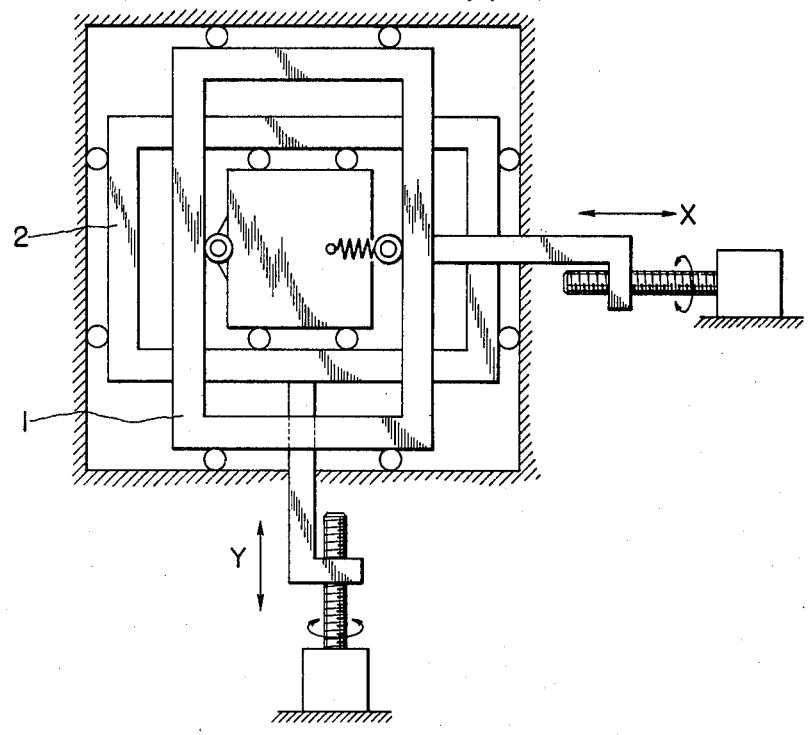
FIG. 1 is a schematic diagram for explaining a known X-Y movable table.
Figure 2:
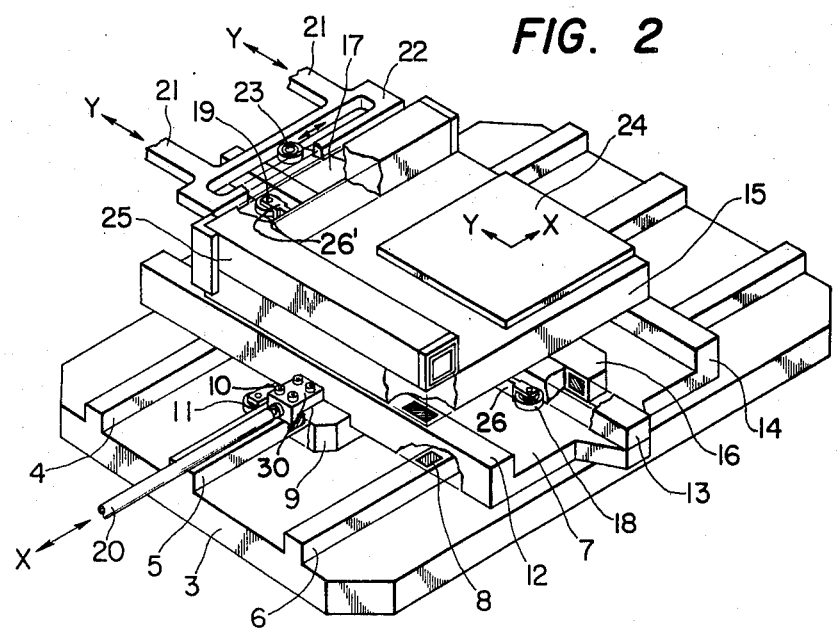
FIG. 2 is a perspective view, partly in section, for explaining an apparatus for precisely moving a table according to an embodiment of this invention.

In FIG. 2, three guide rails 4, 5 and 6 extending along an X-axis are provided on a base 3, and an X-axis movable table 7 slides with its load carried by the guide rails 4 and 6. In four places on the lower surface of the X-axis movable table 7, there are bonded sheets 8 made of a high polymer material, for example, sliders made of ethylene tetrafluoride polymer or the like, to reduce the frictional resistance between the table 7 and the guide rails 4 and 6. Sliding guides are formed by yaw sliders 9 and 10 (the slider 10 does not appear in the figure) which are secured to the middle parts of the X-axis movable table 7 on one side of the rail 5 and are caused to bear against the side surface of the guide rail 5 by bracing means comprised of rollers 11, which are urged by leaf springs against the other side of rail 5. In this regard, only the end of the leaf spring 10 to which one of the rollers 11 is mounted is shown in FIG. 2. Thus, the X-axis movable table 7 carries out a precise rectilinear motion along this guide rail 5.

Similarly, guide rails 12, 13 and 14 extending along a Y-axis are provided on the X-axis movable table 7, and a Y-axis movable table 15 for carrying a workpiece or the like thereon carries out a precise rectilinear motion in the Y-axial direction as a result of the guide rail 13 being held between yaw sliders 16 and 17, on the one hand, and rollers 18 and 19, on the other hand. Likewise, rollers 18, 19 are carried on the leaf springs 26, 26', only the ends of which are visible in FIG. 2. The rectilinear motion of a driving system, which is not shown and which is made up of a combination of a D.C. servomotor, ball screws, etc., is transmitted to the movable tables 7 and 15 in the well-known manner through respective connecting rods (driving rods) 20 and 21 for the X- and Y-axes. The fore end of the connecting rod 20 may be connected to the X-axis table in a laterally constrained manner as represented by the coupling means shown at 30. However, the fore end part of the Y-axis connecting rod assembly 21 is provided with a coupling means in the form of a driving frame 22 having a rectangular opening, within which a roller portion 23, for example, a roller bearing 23, is constrained. Since a rotary shaft of the roller portion 23 is fixed onto the yaw slider 17, the motion of the connecting rod assembly 21 is transmitted to the Y-axial movable table 15 via the yaw slider.

As stated previously, it is a feature of this invention that the width in the Y-axial direction of the rectangular opening of the driving frame 22 is greater than the outside diameter of the roller portion 23; in other words, a backlash or clearance is provided between both the parts 22,23. Therefore, the Y-axial movable table 15 is guided in the X-axial direction by only the X-axial guide rail 5 without being restrained by the driving frames 22 and can move also in the X-axial direction at high precision without causing yaw or spoiling the rectilinearity of the movement.

In the case of moving the Y-axial movable table 15 in the Y-axial direction, naturally the roller portion 23 is driven in contact with the driving frame 22. Therefore, the control for providing the backlash is effected after the Y-axial positioning is complete. The details of this will be described later.

In FIG. 2, the part 24 on the Y-axial movable table 15 is a workpiece (for example, a glass substrate) and the part 25 is a reflector for a laser interference measuring instrument (not shown) which detects the position of the Y-axial movable table 15. In the present embodiment, the position control is carried out by a closed loop control which employs the laser interference measuring instrument as a position sensor. The position control with respect to the X-axis is a conventional linear position control; whereas, in the case of the Y-axis, the ordinary closed loop control incurs hunting and cannot achieve a good positioning accuracy on account of the existence of the backlash.

Figure 3:
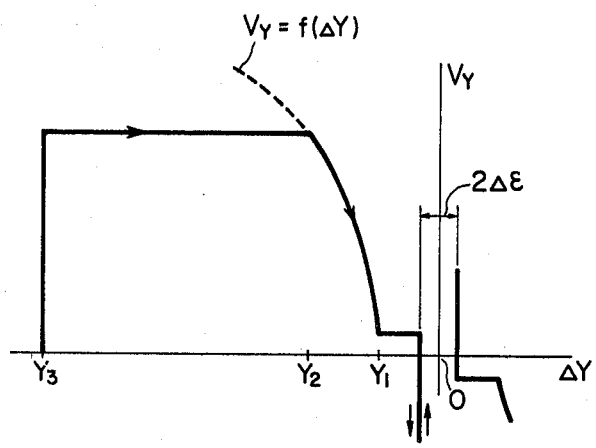
FIG. 3 is a diagram for explaining the Y-axial control in the apparatus of this invention for precisely moving a table.

FIG. 3 is a diagram for explaining the Y-axial control. In the figure, the abscissa represents the position deviation $\Delta Y$ from a desired position O, while the ordinate represents the velocity command $V_Y$ for the D.C. servomotor. By way of example, in the case where precise movement of the workpiece through a distance 10 mm is desired, when a start instruction is given to the position control system, the D.C. servomotor is commanded to rotate at the maximum speed. In the present embodiment, 50 mm/sec, for example, is the maximum speed. Until the Y-axial movable table having started from a position $Y_3$ reaches a position $Y_2$, it moves at the maximum speed. Beyond the position $Y_2$, the velocity command is changed-over to a curve $V_Y = F(\Delta Y)$, and the Y-axial movable table is smoothly decelerated. Further, when a position $Y_1$ is reached, the velocity command becomes a constant speed again, and the Y-axial movable table approaches the desired position at the speed of, for example, 1 mm/sec or so. When a position of $+\Delta \epsilon$ before or behind the desired position is reached, a reverse command is applied to the D.C. servomotor for about 5 ms, for example, and the driving frame 22 is retreated to prepare the backlash.

In the present embodiment, by way of example, the positions $Y_2$ and $Y_1$ are respectively set at 250 $\mu$m and 25 $\mu$m, and the deceleration curve is $V_Y = f(\Delta Y) = 3 - .3\sqrt{|\Delta Y + 25|} + 1.0$ (where the unit of $\Delta Y$ is $\mu$m, and the unit of $f(\Delta Y)$ is mm/sec). The factor $\Delta \epsilon$ is set at 2 $\mu$m, and the amount of the backlash is set at about 60 $\mu$m. These various parameters are determined by the masses of the movable parts, the frictional resistances of the sliding parts, the response characteristic of the D.C. servomotor, etc.

With the above embodiment, a linearity of $\pm 1$ $\mu$m and a yaw of $\pm 3 \times 10^{-6}$ radian have been obtained for a moving range of $150 \times 150$ mm. This has been accomplished because, in accordance with the present invention, any excessive force or moment does not act on the Y-axial movable table. Regarding the positioning time, in the case of a movement of 10 mm by way of example, it was possible to position and set the Y-axial movable table within $\pm 2$ $\mu$m of the desired position in approximately 300 ms. This is also based on the fact that the present invention has made it possible to introduce a sliding guide which is excellent in its property.

This invention is not restricted to the deceleration curve ($V_Y$) illustrated in the specific example, but deceleration curves can be appropriately selected and applied depending upon set conditions.

Figure 4:
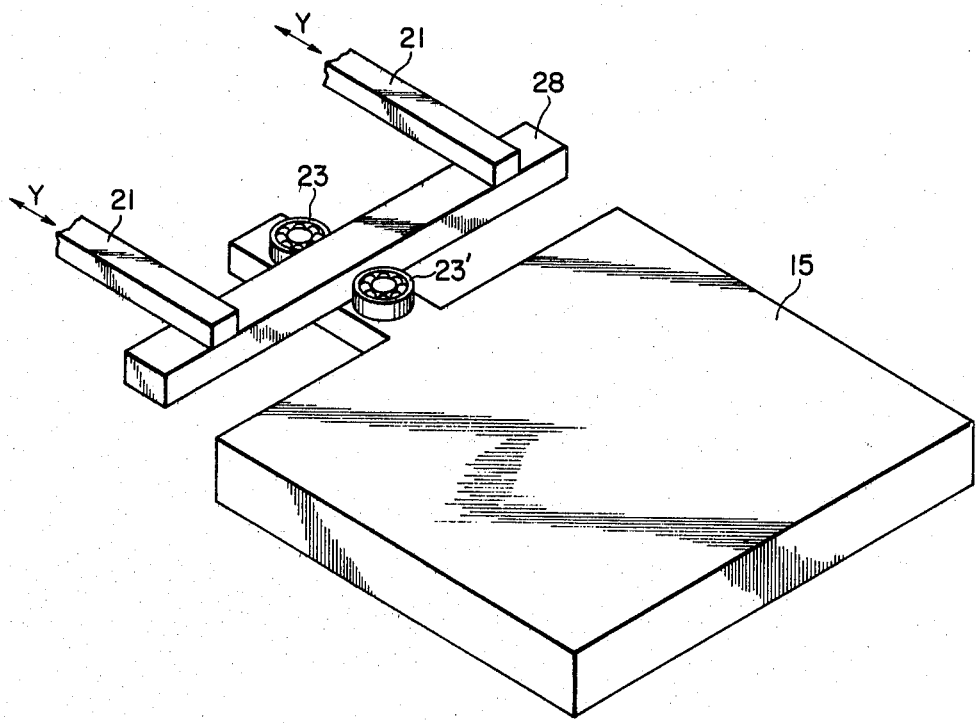
FIG. 4 is a partial detail view for explaining another embodiment of this invention.

According to this invention, the foregoing example of FIG. 2 may well be replaced with a construction as shown in FIG. 4. More specifically, a rod 28 extending in the X-axial direction is provided instead of the driving frame 22 at the fore ends of the Y-axial connecting rods 21, which are secured to the rod 28, and two rollers 23 and 23' have their respective rotary shafts fixed to a part of the Y-axial movable table 15, the rod 28 being held between the rollers 23 and 23' with a backlash. In this case, the same effects as provided in the example of FIG. 2 are attained.

In the case where the sliding guide employing the high polymer material or the like for the sliders is adopted as in the foregoing embodiment, there are the advantages as stated above, but the sliders of the higher polymer material sometimes wear off to change the degree of orthogonality of of the X- and Y-axes. In addition, the coefficient of friction of the sliding portion is comparatively great (for example, approximately 0.2), so that the frictional force against the movement becomes great to degrade the positioning precision. In order to eliminate such problems, the mechanism illustrated in FIG. 5 may be adopted.

Figure 5:
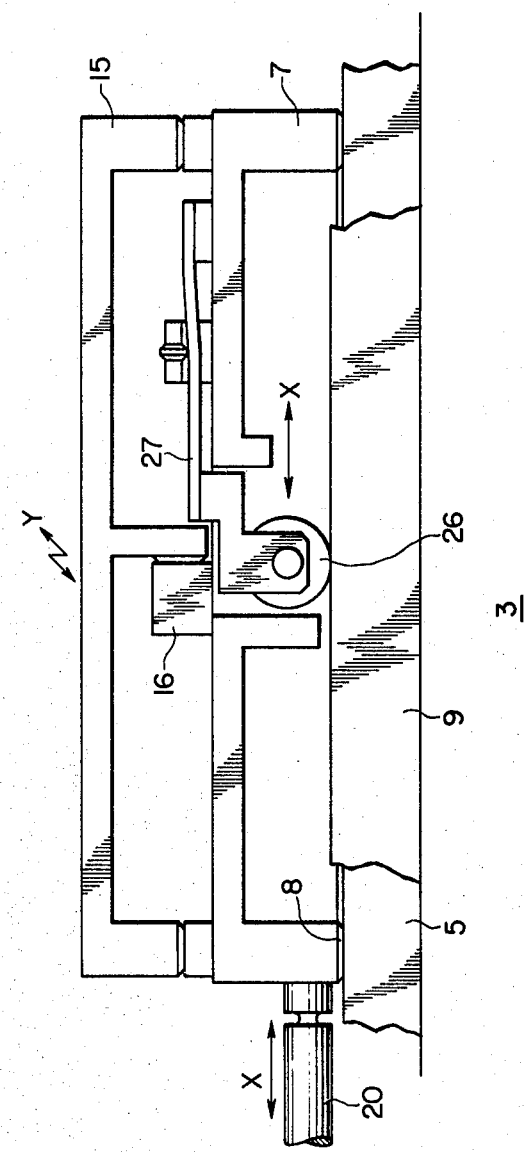
FIG. 5 is a partial detail view showing an example of a load relieving mechanism in accordance with this invention.

FIG. 5 shows a section parallel to the X-axis. This feature of the embodiment consists of a weight lightening mechanism for the X-axial movable table 7 as is made up of a load relieving roller 26 and a spring 27, for example a spring made of a phosphor bronze plate 27. More specifically, the load relieving roller 26 is previously loaded in the gravitational direction by means of the spring 27 which has its fixed end mounted on the X-axial movable table 7, and the roller 26 is placed so as to ride on the guide rail 5, to relieve the load of the X-axial movable table 7 to the amount of the loaded component. Since the position of the load relieving roller 26 is substantially at the central part of the X-axial movable table 7 and coincident with the centroid thereof, loads which act on the four sliders 8 on the lower surface of the X-axial movable table are uniformly relieved. By conjointly employing the rolling guide in this manner, it is possible to reduce the quantity of wear on the respective sliders made of the high polymer material and to lessen the frictional force in the moving direction.

As set forth above, according to this invention, even in the X-Y movement mechanism in which the driving system for both the X- and Y-axes is fixed to the support frame, neither the X-axial movable table nor the Y-axial movable table undergoes any unreasonable force of moment, and excellent rectilinearity and yaw characteristics can be attained. Further, since no excessive force or moment acts as stated above, the sliding guide which is excellent in its property is permitted to be used as the guides in the X- and Y-axial directions, and it is possible to maintain the speed of the positioning operation at a high level. Although this invention can bring forth the greatest effect in the case of employing the sliding guide as the guide of the movable table, it is not restricted thereto, but is also applicable to cases where a rolling guide, a pneumatic bearing guide, etc., is used. This invention is not restricted to the specific numerical values, the materials, etc., used in the foregoing embodiments, but they can be appropriately selected and applied depending upon set conditions.

In this manner, the present invention is greatly effective when applied to workpiece moving tables of high speed and high precision, which are used in semiconductor producing equipment, such as step and repeat cameras and step and repeat projection printing apparatuses, and other precision type measuring instruments and precision machines.

The foregoing embodiments have been described only for the case where the movable members move rectilinearly in two directions intersecting orthogonally, such as the X- and Y-axial directions. However, this invention is not restricted to such a case, but is, of course, applicable to a case where movable members move rectilinearly in two directions defining a certain angle other than 90 degrees therebetween.

While we have shown and described several embodiments in accordance with the present invention, it is to be understood that the same is not limited to the details shown and described herein but is susceptible of numerous changes and modifications as known to those of ordinary skill in the art, and we therefore do not wish to be limited to the details shown and described herein but intend to cover all such changes and modifications as are obvious to one skilled in the art.

What is claimed is:

1. An apparatus for precisely moving a table, comprising:

rectilinear drive means respectively fixed and disposed on X- and Y-coordinate axes;

a movable member;

guide means for constraining the motion of said movable member in the direction of one of the X- and Y-axes by the motion of said rectilinear drive means in the one axial direction and for constraining its motion in the direction of the other axis by the rectilinear motion of said rectilinear drive means in the other axial direction; and coupling means coupling said movable member and said rectilinear drive means with a backlash in at least one of the X- and Y-axial directions;

wherein said movable member is constructed of an X-axial movable table which has its motion in the X-axial direction constrained by the motion of the X-axial rectilinear drive means, and a Y-axial movable table which has its motion in the Y-axial direction constrained by the motion of the Y-axial rectilinear drive means; and wherein the coupling means includes two rollers whose respective rotary shafts are fastened to a part of said Y-axial movable table, and a rod which extends in the X-axial direction and which is held between said two rollers with a spacing which provides said backlash.

2. An apparatus for precisely moving a table as defined in claim 1, wherein said X-axial movable table has its motion in the X-axial direction constrained through first sliding guides, while said Y-axial movable table has its motion in the Y-axial direction constrained through second sliding guides disposed on said X-axial movable table.

3. An apparatus for precisely moving a table, comprising:

rectilinear drive means respectively fixed and disposed on X- and Y-coordinate axes;

a movable member;

guide means for constraining the motion of said movable member in the direction of one of the X- and Y-axes by the motion of said rectilinear drive means in the one axial direction and for constraining its motion in the direction of the other axis by the rectilinear motion of said rectilinear drive means in the other axial direction; and coupling means coupling said movable member and said rectilinear drive means with a backlash in at least one of the X- and Y-axial directions;

wherein said movable member is constructed of an X-axial movable table which has its motion in the X-axial direction constrained by the motion of the X-axial rectilinear drive means, and a Y-axial movable table which has its motion in the Y-axial direction constrained by the motion of the Y-axial rectilinear drive means; and wherein the coupling means comprises a roller portion whose rotary shaft is fastened to a part of said Y-axial movable table and which serves for the Y-axial drive, and a member which has a slot-shaped opening with its one shorter side being greater than an outside diameter of said roller portion so as to provide said backlash and with its other longer side extending in the X-axial direction, said roller portion engaging in said slot-shaped opening.

4. An apparatus for precisely moving a table as defined in claim 2, further including rolling guide means disposed in a central part of said X-axial movable table uniformly relieving loads acting on the said first sliding guides.

5. An apparatus for precisely moving a table as defined in claim 2, wherein said first and second sliding guides are provided with low friction inserts.

6. An apparatus for precisely moving a table as defined in claim 1, further including a support member for said X-axial movable table, and wherein said guide means includes at least one guide rail disposed on said support member in the X-axial direction, a sliding guide secured to said X-axial movable table on one side of said guide rail disposed on said support member, and means carried by said X-axial movable table for biasing said sliding guide against the side of said guide rail disposed on each support member.

7. An apparatus for precisely moving a table as defined in claim 1 or 6, wherein said guide means includes at least one guide rail disposed on said X-axial movable table and extending in the Y-axial direction, a sliding guide secured to said Y-axial movable table on one side of said guide rail disposed on said X-axial table, and means carried by said Y-axial movable table for biasing said sliding guide against the side of said guide rail disposed on said X-axial movable table.

8. An apparatus for precisely moving a table as defined in claim 7, wherein said sliding guides associated with said movable tables are provided with low friction inserts.

9. An apparatus for precisely moving a table in X and Y coordinate directions, comprising:
a support member including at least one first linear guide rail extending in the X coordinate direction;
an X-axis movable table disposed on said support member, and including first guide means in contact with said first linear guide rail of said support member for guiding said X-axis movable table in the X coordinate direction and at least one second linear guide rail extending in the Y coordinate direction;
a Y-axis movable table disposed on said X-axis movable table, and including second guide means in contact with said second linear guide rail of said X-axis movable table for guiding said Y-axis movable table in the Y-coordinate direction;
X-axis rectilinear drive means fixedly disposed with respect to said support member for driving said X-axis movable table exclusively in the X coordinate direction;
Y-axis rectilinear drive means fixedly disposed with respect to said support member for driving said Y-axis movable table exclusively in the Y coordinate direction; and
first coupling means coupling said X-axis rectilinear drive means to said X-axis movable table and second coupling means coupling said Y-axis rectilinear drive means to said Y-axis movable table, one of said first and second coupling means including means providing an intentional backlash in the coordinate direction of movement of the associated drive means so as to effectively uncouple the associated drive means from the associated movable table for movements thereof transverse to the coordinate direction of movement of said associated drive means.

10. An apparatus as defined in claim 9, wherein said second coupling means comprises a roller portion whose rotary shaft is fastened to a part of said Y-axis movable table and a member which has a slot-shaped opening and is coupled to said Y-axis rectilinear drive means, said slot-shaped opening having one shorter side which is greater than the outside diameter of said roller portion, which is engaged therein, to thereby provide said backlash and a longer side extending in the X coordinate direction.

11. An apparatus as defined in claim 9, wherein said second coupling means includes two rollers whose respective rotary shafts are in spaced relationship and are fastened to a part of said Y-axis movable table, and a rod which extends in the X coordinate direction between said two rollers with a spacing therefrom which provides said backlash, said rod being coupled to said Y-axis rectilinear drive means.

* * * * *